United States Patent
Lim et al.

(10) Patent No.: US 6,535,440 B2
(45) Date of Patent: Mar. 18, 2003

(54) APPARATUS AND METHOD FOR PACKAGE LEVEL BURN-IN TEST IN SEMICONDUCTOR DEVICE

(75) Inventors: Kyu-Nam Lim, Kyunggi-do (KR); Jong-hyun Choi, Kyunggi-do (KR); Sang-suk Kang, Kyunggi-do (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/906,896

(22) Filed: Jul. 16, 2001

(65) Prior Publication Data

US 2002/0021603 A1 Feb. 21, 2002

(30) Foreign Application Priority Data

Aug. 9, 2000 (KR) .......................... 2000-46232

(51) Int. Cl.[7] ................................. G11C 7/00
(52) U.S. Cl. ................... 365/201; 365/226; 365/189.09
(58) Field of Search ................ 365/201, 226, 365/189.09, 203, 230.01

(56) References Cited

U.S. PATENT DOCUMENTS

| 5,471,429 A | | 11/1995 | Lee et al. | |
|---|---|---|---|---|
| 5,638,331 A | * | 6/1997 | Cha et al. | 365/201 |
| 5,790,465 A | * | 8/1998 | Roh et al. | 365/201 |
| 6,169,694 B1 | * | 1/2001 | Nam et al. | 365/189.09 |
| 6,256,257 B1 | * | 7/2001 | Park et al. | 365/201 |
| 6,259,638 B1 | * | 7/2001 | Kim | 365/201 |
| 2002/0001217 A | * | 5/2000 | Aritomi et al. | 365/63 |

* cited by examiner

Primary Examiner—David Nelms
Assistant Examiner—Thong Le
(74) Attorney, Agent, or Firm—Marger Johnson & McCollom P.C.

(57) ABSTRACT

An apparatus and a method are disclosed for package level burn-in test circuit in semiconductor devices. The apparatus includes a package burn-in register, a test voltage generator for the package level burn-in test, a burn-in master signal generator, and a burn-in test circuit. The package burn-in register stores a package burn-in set-order from the outside and generates a package burn-in set-signal. The test voltage generator generates burn-in test voltages in response to the package burn-in set-signal and to address signals through first address terminals from the outside. The burn-in master signal generator generates a burn-in master signal by combining and receiving the second address signal form first address terminals, a wafer burn-in enable signal from a control signal input terminal, and the package burn-in set-signal. After receiving the burn-in master signal, multiple address signals from multiple third address terminals, and the test voltages for the package level burn-in test, the burn-in test circuit performs a package level burn-in test.

18 Claims, 7 Drawing Sheets

APPARATUS AND METHOD FOR PACKAGE LEVEL BURN-IN TEST IN SEMICONDUCTOR DEVICE

CROSS REFERENCE TO RELATED APPLICATIONS

This application claims the benefit of Korean Patent Application No. 2000-46232, filed on Aug. 9, 2000, under 35 U.S.C. §119, the entirety of which is hereby incorporated by reference.

BACKGROUND OF THE INVENTION

1. Field of the Invention

The present invention relates to an apparatus and a method for a burn-in test in semiconductor device, and more specifically for a package level burn-in test.

2. Description of Related Art

It is important to test mass produced semiconductor memory chips before using them. But it takes too much time to test their normal operation life span in their expected normal surroundings. Therefore, it is desired to test in a way that uses reduced test time, so as to predict their life span.

This is accomplished by a burn-in test. The burn-in test is a method that applies excess stresses to chips in a short period in worse surroundings than the expected normal surroundings. Then life spans of chips in actual operation surroundings are guaranteed for only those products that had passed such stress tests.

Burn-in tests are preformed more efficiently, as wafer level burn-in tests. Those include not only DC voltage tests, but sensing and writing operation tests, which are effective in screening out bad chips.

FIG. 1 is a configuration illustrating a conventional wafer level burn-in test circuit. The chips of a wafer are divided by scribe lines. One of them is placed in the test circuit.

The test circuit includes a burn-in test circuit 10, and dummy pad unit 20 for receiving various types of test voltages.

After receiving a wafer burn-in enable signal WBE, the wafer burn-in circuit 10 generates a master test signal PWBE. At this point, the wafer burn-in circuit 10 receives test voltages VPP, VBB, VP, and VBL through dummy pad unit 20 from the outside, to provide a stable DC supply. In addition, the wafer burn-in circuit 10 receives various test control signals through address pads A0 to A5 for the burn-in test.

A problem in the prior art is that the above described arrangement can perform a burn-in test only in a wafer state, but not in a package state. That is because the dummy pad unit 20 cannot be connected to the outside in the package state.

Therefore, many studies for package level burn-in test have been done. The U.S. Pat. Nos. 5,471,429 and 5,638,331 disclose circuits and methods for package level burn-in tests. However, they work only by using fuses, which limits the burn-in test from being performed once only. That is because an automated process must be halted to replace them.

SUMMARY OF THE INVENTION

To overcome the above-described problems, the present invention provides an apparatus and a method for a package level burn-in test in semiconductor devices.

The apparatus includes a package burn-in register, a test voltage generator for the package level burn-in test, a burn-in master signal generator, and a burn-in test circuit. The package burn-in register stores a package burn-in set-order from the outside and generates a package burn-in set-signal. The test voltage generator generates burn-in test voltages in response to the package burn-in set-signal and to address signals through first address terminals from the outside. The burn-in master signal generator generates a burn-in master signal by combining and receiving the second address signal form first address terminals, a wafer burn-in enable signal from a control signal input terminal, and the package burn-in set-signal. After receiving the burn-in master signal, multiple address signals from multiple third address terminals, and the test voltages for the package level burn-in test, the burn-in test circuit performs a package level burn-in test.

Therefore, by receiving test voltages and test control signals required in a burn-in test, the present invention performs a package level burn-in test in the same method of a wafer level burn-in test. No fuses are needed, or their time to replace them after each time they burn out.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which.

DETAILED DESCRIPTION OF PREFFERED EMBODIMENTS

Reference will now be made in detail to the preferred embodiment of the present invention, an example of which is illustrated in the accompanying drawings.

Figure 1:
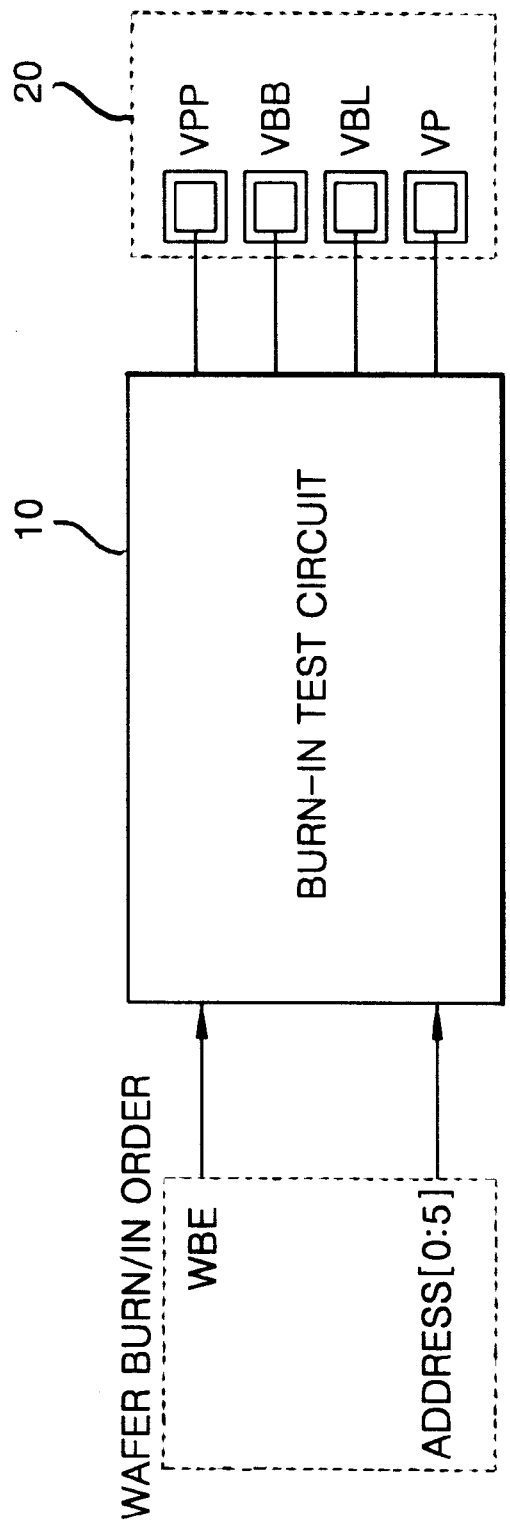
FIG. 1 is a block diagram illustrating a conventional wafer level burn-in test circuit.
Figure 2:
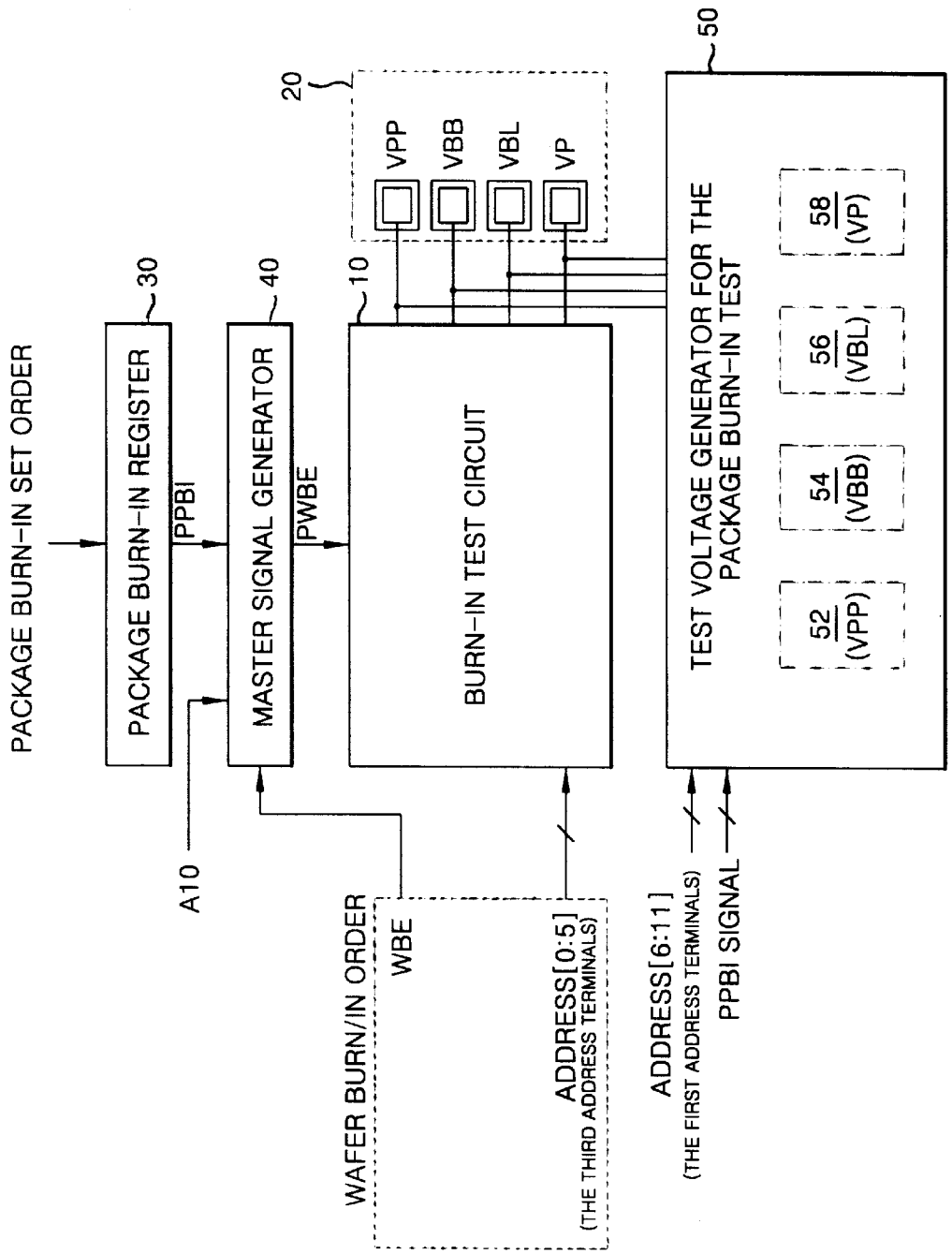
FIG. 2 is a block diagram illustrating a package level burn-in test circuit.

FIG. 2 is a configuration illustrating a package level burn-in test circuit, according to a preferred embodiment of the present invention.

As shown in FIG. 2, the burn-in test circuit includes a conventional wafer burn-in test circuit 10, dummy pad unit 20, a package burn-in register 30, a burn-in master signal generator 40, and a test voltage generator 50 for a package level burn-in test. Necessary signals for a package level burn-in test are generated in the inside of the chip because dummy pad unit 20 cannot be connected to the outside at the package state. The package burn-in register 30 receives a package burn-in set-order from the outside, and then generates a package burn-in set-signal PPBI.

Figure 3:
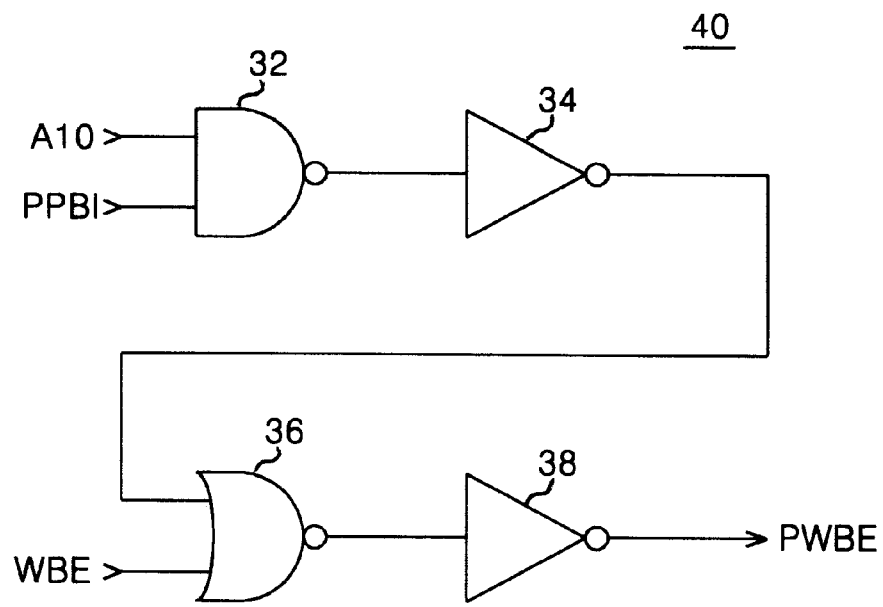
FIG. 3 is a logic circuit illustrating a generation of a burn-in master signal for the circuit of FIG. 2.

As shown in FIG. 3, the burn-in master signal generator 40 includes a NAND gate 32, a NOR gate 36, and inverters 34 and 38. The burn-in master signal generator 40 combines an address terminal A10, the package burn-in set-signal PPBI and a wafer burn-in enable signal WBE, and then generates a burn-in master signal PWBE.

In a wafer level burn-in test, the master signal generator 40 receives the wafer burn-in enable signal WBE, and then generates a burn-in master signal PWBE. In a package level burn-in test, however, the master signal generator 40 receives signals from the address terminal A10 and the package burn-in set-signal PPBI, and then generates a burn-in master signal PWBE.

Figure 4:
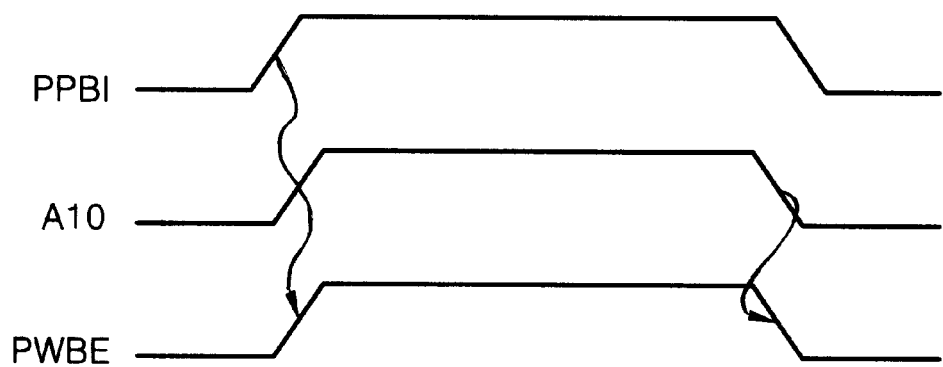
FIG. 4 is a waveform diagram illustrating the relative timing of the signals in FIG. 3.

FIG. 4 shows the relative timing of the key signals. The burn-in master signal PWBE is enabled to be a logic "high" level in the condition that a signal from address terminal A10 is enabled to be a logic "high" level after a package burn-in set-signal PPBI is enabled to be a logic "high" level through the package burn-in register 30 in the package state.

Returning to FIG. 2, the voltage generator 50 for a package level burn-in test receives the package burn-in set-signal PPBI and address signals from first address terminals A6 to A11, and then generates test voltages, VPP, VBB, VBL, and VP, necessary in the burn-in test circuit 10. Then, the voltage generator 50 for a package level burn-in test provides those test voltages to burn-in test circuit 10 in the same method that those test voltages are applied through dummy pad unit 20 at the wafer level burn-in test. The wafer level burn-in test does not employ address signals from first address terminals A6 to A11. At this point, a test voltage VPP for the burn-in test is a word line step-up voltage, a test voltage VBB is a substrate back-bias voltage, a test voltage VBL is a bit line pre-charge voltage, and a test voltage VP is a plate voltage for a cell capacitor.

The test voltage generator 50 for package level burn-in test includes a VPP test voltage generator 52, a VBB test voltage generator 54, a VBL test voltage generator 56, and a VP test voltage generator 58.

Figure 5:
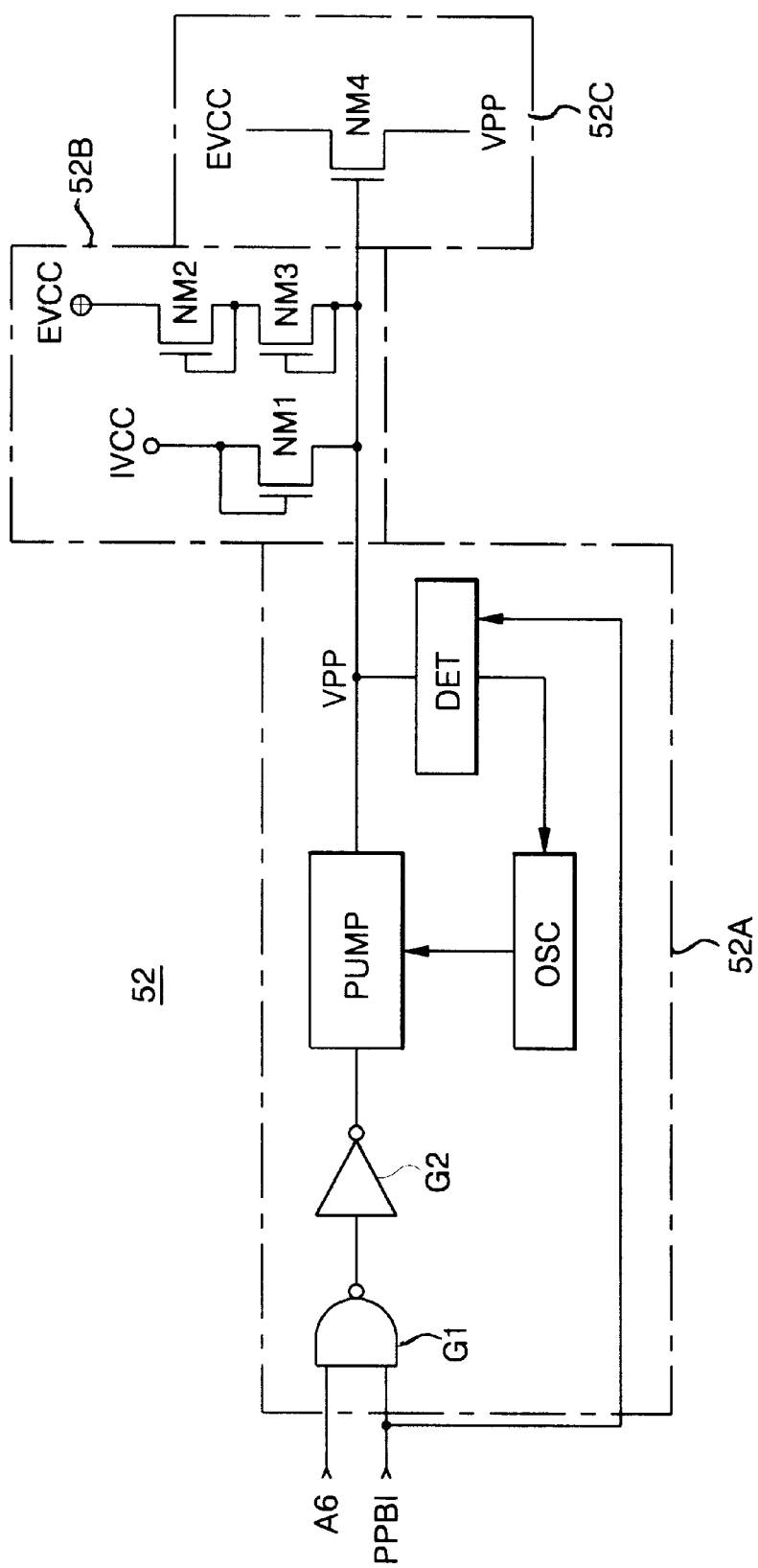
FIG. 5 is a circuit diagram illustrating a preferred VPP test voltage generator of the circuit of FIG. 2.

Referring to FIG. 5, the VPP test voltage generator 52 includes a pumping circuit 52A, a holding unit 52B, and an operating unit 52C. The pumping circuit 52A pumps a test voltage VPP in response to the first address signal A6 in multiple first terminals and the package burn-in set-signal PPBI. The holding unit 52B holds an output voltage VPP of the pumping circuit 52A to a voltage of an EVCC+2VTN level. By employing a voltage of an EVCC+2VTN level held in the holding unit 52B, the operating unit 52C converts a voltage of an EVCC level into a test voltage VPP and operates the test voltage VPP.

The pumping circuit 52A includes a NAND gate G1, an inverter G2, a pumping circuit PUMP, an oscillator OSC, and a detector DET. The pumping circuit PUMP is enabled to generate a test voltage VPP in the case that the package burn-in set-signal PPBI and the first address signal A6 in multiple first terminals are in logic "high" levels. The detector DET generates a control signal for the oscillator OSC by comparing a reference voltage with the output voltage from the pumping circuit PUMP, when the first address signal A6 in multiple first terminals is in a logic "high" level.

The holding unit 52B includes NMOS transistors NM1, NM2, and NM3. The NM2 and NM3 transistor turn on in the case that the output voltage of pumping circuit PUMP is raised up to a voltage of an EVCC+2VTN level. Then, the NM2 and NM3 transistor bypass the output voltage of pumping circuit PUMP to hold a voltage of NM4 transistor gate in the operating unit 52C to a voltage of an EVCC+2VTN level. The operating unit 52C outputs a test voltage VPP of an EVCC level.

Figure 6:
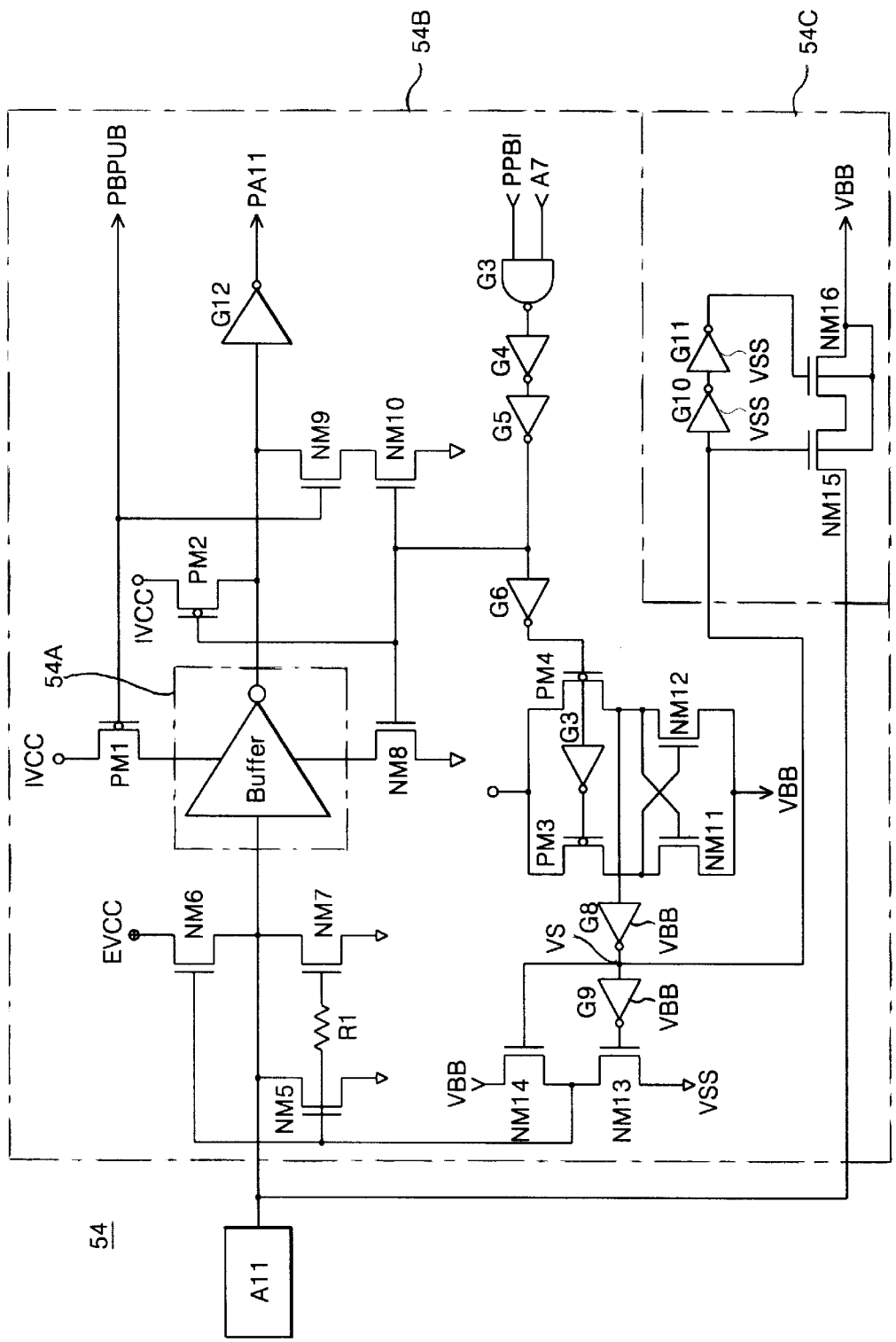
FIG. 6 is a circuit diagram illustrating a preferred VBB test voltage generator of the circuit of FIG. 2.

Referring now to FIG. 6, the VBB voltage generator 54 includes a VBB controller 54B, and a switching unit 54C. The VBB controller 54B disables an address buffer 54A connected to the fourth address terminal A11, in response to the second address signal A7 from first address terminals and the package burn-in set-signal PPBI. The switching unit 54C outputs a test voltage VBB inputted through the fourth address terminal A11 in response to the switching control signal.

The VBB controller 54B includes NMOS transistors NM5 to NM14, PMOS transistors PM1 to PM4, and gates G3 to G9 and G12. The VBB controller 54B enables the address buffer 54A to be in a logic "high" level in the condition that both the package burn-in set-signal PPBI and the second address signal A7 from first address terminals are in logic "high" levels. Then, the VBB controller 54B enables a signal PA11 to be in a logic "low" level, a switching control-signal VS to be in a logic "high" level, and an address buffer 54A to maintain the test voltage VBB. Therefore, the VBB controller 54B controls the test voltage VBB inputted through the fourth address terminal A and outputs the test voltage VBB through the switching unit 54C.

The switching unit 54C includes inverters G10 and G11, and NMOS transistors NM15 and NM16. The switching unit 54C turns on the NMOS transistors NM15 and NM16, in a logic "high" level of the switching control signal VS.

Therefore, in a package level burn-in test, the VBB controller 54B controls the test voltage VBB inputted through the fourth address terminal All and outputs the test voltage VBB through the switching unit 54C. In a normal mode, the switching unit 54C is in a turn-off state. Therefore, the address buffer 54A buffers an address signal through the fourth address terminal A11 and outputs the signal PA11.

Figure 7:
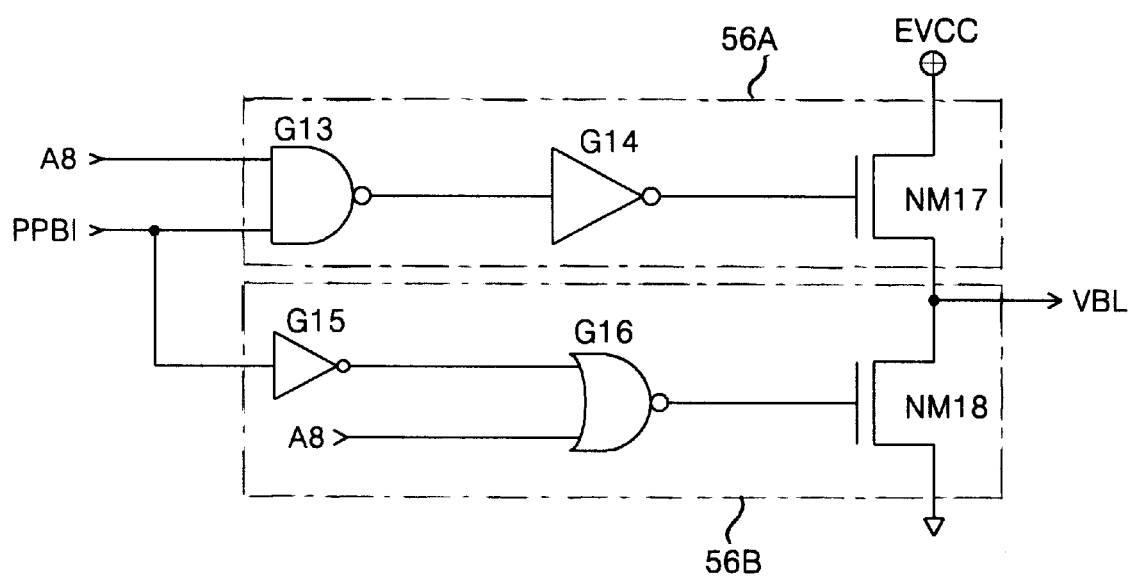
FIG. 7 is a circuit diagram illustrating a preferred VBL test voltage generator of the circuit of FIG. 2.

Referring now to FIG. 7, a VBL voltage generator 56 includes a pull-up unit 56A and a pull-down unit 56B. The pull-up unit 56A includes a NAND gate G13, an inverter G14, and a NMOS transistor NM17. The pull-down unit 56B includes an inverter G15, a NOR gate G16, and a NMOS transistor NM18.

In response to the package level burn-in test set-signal PPBI, the pull-up unit 56A converts an voltage of an EVCC-VTN level into a test voltage VBL for a package level burn-in test in the case that the third address signal A8 of multiple first address terminals is in a logic "high" level. In a similar way, the pull-down unit 56B generates the test voltage VBL of a "0" level in the case that the third address signal A8 of multiple first address terminals is in a logic "low" level.

Figure 8:
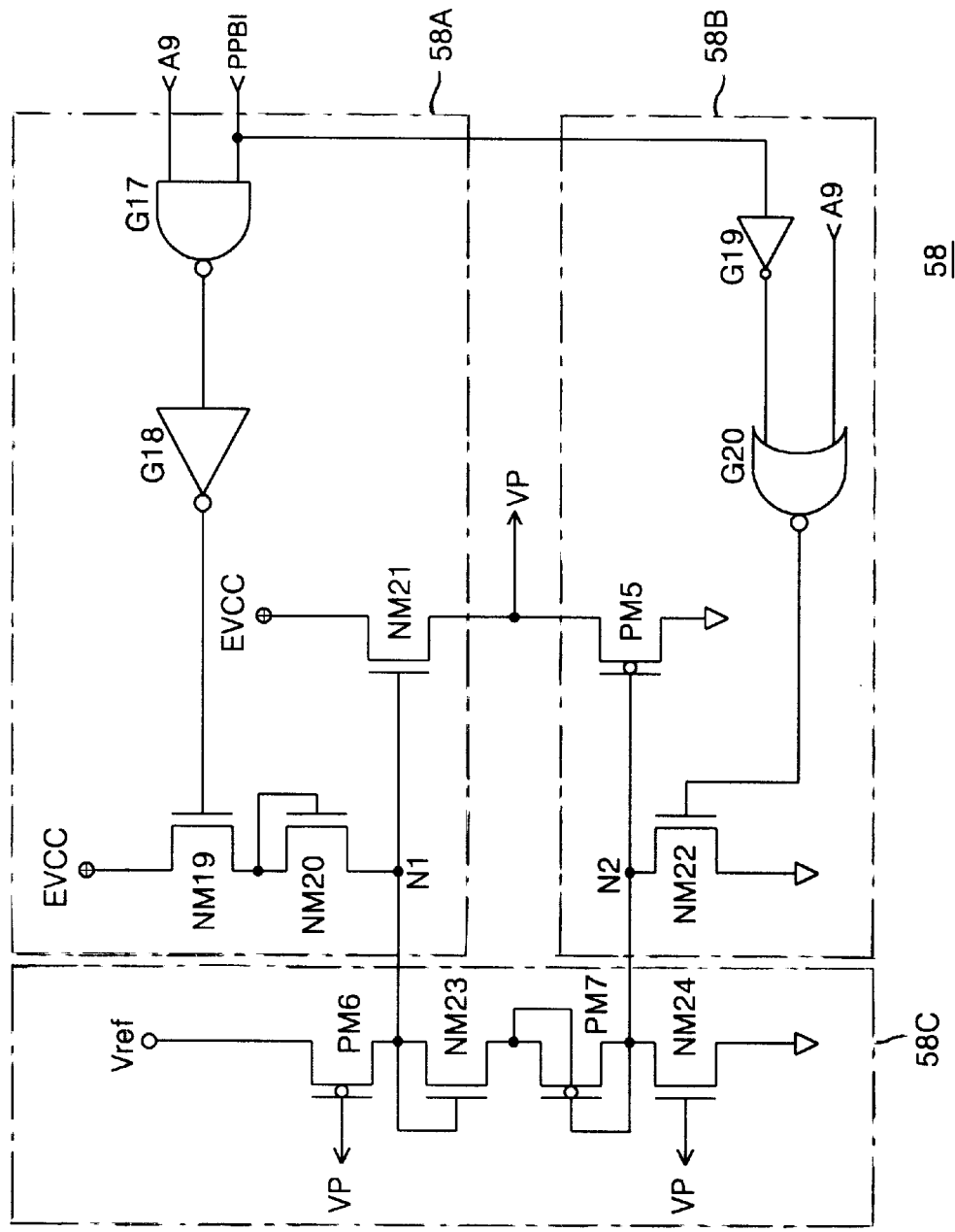
FIG. 8 is a circuit diagram illustrating a preferred VP test voltage generator for of the circuit of FIG. 2.

Referring now to FIG. 8, a VP voltage generator 58 includes a pull-up unit 58A, a pull-down unit 58B, and a standard voltage generator 58C. The pull-up unit 58A includes a NAND gate G17, an inverter G18, and NMOS transistors, NM19 to NM21. The pull-down unit 581B includes an inverter G19, a NOR gate G20, a PMOS transistor PM5, and a NMOS transistor NM22. The standard voltage generator 58C includes PMOS transistors PM6 and PM7, and NMOS transistors NM23 and NM24.

In response to the package burn-in set-signal PPBI, the pull-up unit 58A converts an voltage of an EVCC−3VTN level into a test voltage VP for the package level burn-in test in the case that the fourth address signal A9 of multiple first terminals is in a logic "high" level. In a similar way, the pull-down unit 58B generates the test voltage VBL of a |VTP| level for the package level burn-in test, in the condition that the fourth address signal A9 of multiple first address terminals is in a logic "low" level. The pull-up unit 58A turns on NMOS transistor NM19 in the condition that the address signal A9 of multiple first address terminals and the package burn-in set-signal PPBI are in logic "high" levels, and then generates a test voltage VP of an EVCC−3VTN level. Then, the standard voltage generator 58C generates a standard voltage so that the voltage between a node N1 and the output terminal of the test voltage VP can maintain a voltage of a VTN level. The pull-down unit 58B turns on NMOS transistor NM22 in the condition that the address terminal A9 is in a logic "low" level and the package burn-in set-signal PPBI is in a logic "high" level, and then generates a test voltage VP of a |VTP| level. Then, the standard voltage generator 58C generates a standard voltage so that the voltage between a node N2 and the output terminal of the test voltage VP can maintain a voltage of a |VTP| level.

Thus, by generating test voltages VPP, VBB, VBL, and VP, and a burn-in master signal PWBE combined the package burn-in set-signal PPBI and a signal from the second address terminal A10 instead of the wafer burn-in enable signal WBE, a burn-in test circuit 10 prepares a package level burn-in test surroundings similar to that of a wafer level burn-in test.

In the above-mentioned package level burn-in test surroundings, applying various burn-in control signals through the third address terminals A0 to A5 performs a package level burn-in test in similar to that of a wafer level.

Therefore, by operating conventional wafer level burn-in equipment without preparing extra test equipment for a package level burn-in test, the preferred embodiment of the present invention performs the package level burn-in test.

While the invention has been particularly shown and described with reference to preferred embodiments thereof, it will be understood by those skilled in the art that the foregoing and other changes in form and details may be made therein without departing from the spirit and scope of the invention.

What is claimed is:

1. An apparatus for a package level burn-in test in a semiconductor device, comprising:
    a package burn-in register for storing a package burn-in set-order from the outside and for generating a package burn-in set-signal;
    a test voltage generator for a package level burn-in test for generating test voltages in response to the package burn-in set-signal and to multiple address signals inputted through first address terminals from the outside, the test voltage generator including a word line step-up voltage generator, a substrate back bias voltage generator, a bit line pre-charge voltage generator, and a plate voltage generator for a cell capacitor;
    a burn-in master signal generator for generating a burn-in master signal by combining an address signal inputted through a second address terminal, a wafer burn-in enable signal inputted through the control signal input terminals, and the package burn-in set-signal; and
    a burn-in test circuit for performing a package level burn-in test by empoying test voltages for the package level burn-in test, the burn-in master signal, and multiple address signals through multiple third address signal terminals.

2. The apparatus of claim 1, wherein the word line step-up voltage generator includes
    a pumping circuit for pumping the word line step-up voltage in response to the package burn-in set-signal and to the first address signal inputted through multiple first address signal terminals;
    a holding unit for holding an output voltage of the pumping circuit in an EVCC+2VTN level; and
    an operating unit for converting a voltage of an EVCC level into the word line step-up voltage and for operating the word line step-up voltage in the condition that the holding unit holds a voltage of an EVCC+2VTN level.

3. The apparatus of claim 1, wherein the substrate back-bias voltage generator includes
    a substrate back-bias voltage controller for generating a switching control signal and for disabling an address buffer connected the fourth address terminal in response to the package burn-in set-signal and to the second address signal inputted through multiple first address signal terminals; and
    a switching unit for converting a substrate back-bias voltage inputted through the fourth address terminal to the substrate back-bias voltage in response to the switching control signal.

4. The apparatus of claim 1, wherein the bit line pre-charge voltage generator includes
    a pull-up unit for generating the bit line pre-charge voltage in a logic "high" level, in the case that the third address signal inputted through multiple first address terminals in response to the package burn-in set-signal is in a logic "high" level; and
    a pull-down unit for generating a bit line pre-charge voltage in a logic "low" level for the package level burn-in test in the case that the third address signal inputted through multiple first address terminals is in a logic "low" level.

5. The apparatus of claim 1 wherein the plate voltage generator for a cell capacitor includes
    a pull-up unit for generating a plate voltage for a cell capacitor in a logic "high" level in the case that the fourth address signal inputted through multiple first address terminals in response to the package burn-in set-signal is in a logic "high" level; and
    a pull-down unit for generating a plate voltage for a cell capacitor in a logic "low" level in the case that the fourth address signal inputted through multiple first address terminals is in a logic "low" level.

6. A package level burn-in test method in a semiconductor device, comprising:
    storing a package burn-in set-order to generate a package burn-in set signal;
    generating a burn-in master signal in response to the package burn-in set signal;
    generating test voltages for a package level burn-in test in response to the package burn-in set signal, including generating a substrate back bias voltage; and
    performing a package level burn-in test by employing the generated burn-in master signal and the test voltages.

7. The method of claim 6, wherein
    performing the burn-in test is performed by receiving inputs also from a first group of address pins; and
    generating the test voltages is performed by receiving inputs also from a second group of the address pins.

8. A resuable package level burn-in test facilitator structured to successfully test a semiconductor device two or more times, the testing facilitator included in a package to be tested that includes a plurality of pins, the test facilitator comprising:
    a register for receiving a test commencing signal from one of the plurality of pins and for generating a package burn-in set-signal;

an on-chip test voltage generator for generating test voltages, the voltage generator structured to receive a set of one or more external voltages from some of the plurality of pins, and structured to generate from the set of external voltages and in response to the package burn-in set-signal, a set of one or more testing voltages that are different than the set of external voltages;

a burn-in master signal generator for generating a burn-in master signal from an address signal, a wafer burn-in enable signal, and the package burn-in set-signal; and a burn-in test circuit structured to apply the generated testing voltages to the semiconductor device to be tested.

9. The test facilitator of claim 8 wherein the address signal is received from one of the plurality of pins.

10. The test facilitator of claim 8 wherein the wafer burn-in enable signal is received from one of the plurality of pins.

11. The test facilitator of claim 8 wherein the test voltage generator comprises a word line step-up voltage generator.

12. The test facilitator of claim 11 wherein the word line step-up voltage generator comprises:

a pumping circuit for pumping a word line step-up voltage;

a holding unit coupled to the pumping circuit and for holding an output voltage of the pumping circuit; and an operating unit coupled to the holding unit and for applying the word line step-up voltage.

13. The test facilitator of claim 8 wherein the the test voltage generator comprises a substrate back-bias voltage generator.

14. The test facilitator of claim 13 wherein the substrate back-bias voltage generator comprises:

an address terminal coupled to an address pin, the address pin structured to have a testing voltage signal applied thereto;

a substrate back-bias voltage controller for generating a switching control signal and for disabling a buffer that is connected to the address terminal; and a switching unit for converting the testing voltage signal inputted through the address terminal to the substrate back-bias voltage in response to the switching control signal.

15. The test facilitator of claim 8 wherein the the test voltage generator comprises a bit line pre-charge voltage generator.

16. The test facilitator of claim 15, wherein the bit line pre-charge voltage generator comprises:

an address terminal coupled to an address pin, the address pin structured to have a testing voltage signal applied thereto;

a pull-up unit for generating a "high" level bit line pre-charge voltage when the testing voltage signal and the package burn-in set signal have high levels; and a pull-down unit for generating a "low" level bit line pre-charge voltage when the testing voltage signal has a low level.

17. The test facilitator of claim 8 wherein the the test voltage generator comprises a plate voltage generator for a cell capacitor.

18. The test facililitator of claim 17 wherein the plate voltage generator for a cell capacitor comprises:

an address terminal coupled to an address pin, the address pin structured to have a testing voltage signal applied thereto;

a pull-up unit for generating a plate voltage for a cell capacitor having a logic "high" level when the testing voltage signal and the package burn-in set signal have high levels; and a pull-down unit for generating a plate voltage for a cell capacitor having a logic "low" level when the testing voltage signal has a low level.

* * * * *

UNITED STATES PATENT AND TRADEMARK OFFICE
CERTIFICATE OF CORRECTION

PATENT NO. : 6,535,440 B2  Page 1 of 1
DATED : March 18, 2003
INVENTOR(S) : Lim et al.

It is certified that error appears in the above-identified patent and that said Letters Patent is hereby corrected as shown below:

<u>Column 4,</u>
Line 29, "terminal All and" should read -- terminal A11 and --.
Line 54, "unit 581B" should read -- unit 58B --.

Signed and Sealed this

Sixth Day of April, 2004

JON W. DUDAS
*Acting Director of the United States Patent and Trademark Office*